(12) United States Patent
Takenaka

(10) Patent No.: US 6,869,897 B2
(45) Date of Patent: Mar. 22, 2005

(54) MANUFACTURING METHOD FOR SEMICONDUCTOR SUBSTRATE, AND SEMICONDUCTOR DEVICE HAVING A STRAINED SI LAYER

(75) Inventor: Masahiro Takenaka, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/655,556

(22) Filed: Sep. 5, 2003

(65) Prior Publication Data

US 2004/0075106 A1 Apr. 22, 2004

(30) Foreign Application Priority Data

Sep. 9, 2002 (JP) ............................ 2002-263158

(51) Int. Cl.$^7$ ..................... H01L 21/26; H01L 21/324; H01L 21/322; H01L 21/265
(52) U.S. Cl. ..................... 438/798; 438/478; 438/509; 438/518; 438/522; 438/933
(58) Field of Search ..................... 438/518, 522, 438/509, 933, 520, 766, 796–798, 478, 308, 378, 507; 257/18–19, 190–191, 194

(56) References Cited

U.S. PATENT DOCUMENTS

| 5,534,713 A | * | 7/1996 | Ismail et al. ................ 257/24 |
| 6,562,703 B1 | * | 5/2003 | Maa et al. ................ 438/518 |
| 6,593,641 B1 | * | 7/2003 | Fitzergald ................ 257/616 |
| 6,703,293 B2 | * | 3/2004 | Tweet et al. ................ 438/518 |
| 6,746,902 B2 | * | 6/2004 | Maa et al. ................ 438/149 |
| 6,793,731 B2 | * | 9/2004 | Hsu et al. ................ 117/3 |

OTHER PUBLICATIONS

H. Trinkaus et al., "Strain relaxation mechanism for hydrogen–implanted $Si_{1-x}Ge_x/Si(100)$ heterostructures", Applied Physics Letters, vol. 76, No 24, Jun. 12, 2000, pp. 3552–3554.

D. M. Follstaedt et al., "Cavity–dislocation interactions in Si–Ge and implications for heterostructure relaxation", Applied Physics Letters, 69 (14), Sep. 30, 1996, pp. 2059–2061.

* cited by examiner

Primary Examiner—Shouxiang Hu
(74) Attorney, Agent, or Firm—Nixon & Vanderhye, P.C.

(57) ABSTRACT

The present invention provides a method for manufacturing a semiconductor substrate, comprising the step of: forming a first buffer Si layer on a substrate having a silicon surface; epitaxially growing, in sequence, a first strained SiGe layer and a first Si layer above the first buffer Si layer; implanting ions into the resulting substrate followed by annealing so as to relax the lattice of the first strained SiGe layer and to thereby providing tensile strain in the first Si layer and so that tensile strain is provided in the first Si layer; and epitaxially growing, in sequence, a second buffer Si layer and a second SiGe layer above the resulting substrate; and forming a second Si layer having tensile strain on the second SiGe layer.

5 Claims, 7 Drawing Sheets

Id-Vd characteristics of NMOS

Gm(dId-dVg) characteristics of NMOS

Id-Vd characteristics of PMOS

Gm($\Delta$Id-$\Delta$Vg) characteristics of PMOS

MANUFACTURING METHOD FOR SEMICONDUCTOR SUBSTRATE, AND SEMICONDUCTOR DEVICE HAVING A STRAINED SI LAYER

CROSS-REFERENCE TO RELATED APPLICATION

This application is related to Japanese application No. 2002-263158 filed on Sep. 9, 2002, whose priority is claimed under 35 USC § 119, the disclosure of which is incorporated by reference in its entirety.

BACKGROUND OF THE INVENTION

1. Field of the Invention

The present invention relates to a manufacturing method for a semiconductor substrate, a semiconductor substrate and a semiconductor device, in particular relates to a manufacturing method for a semiconductor substrate having a strained Si layer, a semiconductor substrate having a strained Si layer and a semiconductor device having a strained Si layer.

2. Description of Related Art

Increasing the mobility of electrons and holes that move in a semiconductor element is an effective means for enhancing the performance of a semiconductor device.

In a semiconductor device formed in a substrate made of silicon monocrystal, however, the upper limit of mobility of electrons that move in the silicon monocrystal is, in general, determined by the physical characteristics of the silicon monocrystal.

On the other hand, the mobility of electrons increases in strained silicon crystal in comparison with unstrained silicon crystal.

Therefore, there is a conventional method wherein an SiGe crystal layer having a lattice constant greater than that of silicon is formed in a virtual lattice form on a silicon substrate and strain in the SiGe film due to mismatch in the lattice constants of the SiGe film and the silicon substrate is relaxed by introducing a misfit dislocation and, after that, a Si film is formed on the SiGe film as a cap layer. Distortion occurs in this Si film because this Si film is pulled by the SiGe film having a lattice constant greater than that of the Si film and, thereby, the band structure is changed so that the mobility of carriers can be increased.

As for a method for relaxing the above described lattice strain in the SiGe film, methods are know wherein several $\mu$m of a SiGe film is grown as a thick film and, thereby, the elastic strain energy of the SiGe film is increased so that the lattice is relaxed. Y. J. Mii, et al., for example, have published an article in Appl. Phys. Lett. 59 (13), 1611 (1991) disclosing a method for relaxing strain in a SiGe film wherein the Ge concentration in a SiGe film is gradually increased so that approximately 1 $\mu$m of SiGe film having a graded concentration is formed.

In addition, the following method is known as a method for relaxing the strain in a SiGe film in a thin film form. When high-temperature annealing is carried out after ions, such as of hydrogen, are implanted in a SiGe film, layered defects created in a defective layer within the silicon substrate cause slippage. This slippage causes a misfit dislocation at the interface of the SiGe film/Si substrate and relaxes the lattice strain. This method has been proposed by D. M. Follstaedt, et al. and by H. Trinkaus, et al. (see, for example, Appl. Phys. Lett. 69 (14), 2059 (1996) and Appl. Phys. Lett. 76 (24), 3552 (2000)). Here, relaxation of strain by means of He ion implantation and relaxation of strain by means of hydrogen ion implantation are described.

In the case of a method for relaxing lattice strain in these SiGe films in thin film forms, a strained Si layer is formed on a SiGe film as a cap layer after the strain in the SiGe film in a thin film form is relaxed. General examples of a substrate structure provided with such a cap layer are a cap Si layer/second SiGe layer/first SiGe layer structure and a cap Si layer 27/second SiGe layer 26/first SiGe layer 23/Si buffer layer 22/Si substrate 21 structure, as shown in FIG. 8. Here, Si buffer layer 22 on Si substrate 21, shown in FIG. 8, is formed in order to greatly restrict the dangling bonds on the surface of the Si substrate 21.

According to a method for relaxing the lattice wherein a SiGe film is formed as a thick film and the elastic strain energy of the SiGe film made great as described above, however, the film thickness exceeds the critical film thickness for gaining perfect crystallinity. Therefore, an extremely great number of defects occur in the SiGe film. In addition, it is necessary to form a thick SiGe film, having a thickness of several $\mu$m, and a problem arises wherein the manufacturing cost becomes great.

Furthermore, there is a problem in regard to a method wherein high-temperature annealing is carried out after ions, such as of hydrogen, are implanted into a SiGe film that has been formed as a thin film, wherein leak current is great in a MOS transistor fabricated using the resulting substrate.

SUMMARY OF THE INVENTION

The present invention is provided in view of the above described problems and a purpose thereof is to provide a method for manufacturing a semiconductor substrate having a strained Si/SiGe/Si structure wherein the strained SiGe film in the semiconductor substrate has a high degree of relaxation of strain and has a thickness no greater than the critical film thickness, and the semiconductor substrate has a strained Si layer of which the defect concentration has been reduced.

The present inventors have diligently carried out research in regard to a substrate gained by carrying out high-temperature annealing after ions, such as of hydrogen, are implanted into a conventional SiGe film in a thin film form. As a result, the inventors have discovered that oxygen is not sufficiently removed from the surface of the first SiGe film when the Si film, which is a cap layer, or the second SiGe film is epitaxially grown after the relaxation of the lattice of the first SiGe film, which has been grown as a thin film. That is to say, the inventors have discovered that the oxygen concentration has reached the peak value at the interface between the first SiGe layer and the second SiGe layer in the cap Si layer/second SiGe layer/first SiGe layer/Si substrate structure according to the result of analysis by means of SIMS of the distribution of the concentration of the oxygen, as shown in FIG. 6. Furthermore, proportional relationships between the junction leak current of a strained Si-MOS transistor and the peak concentration of oxygen existing between first SiGe film/second SiGe film were determined as shown in FIG. 7. That is to say, defects due to this residual oxygen cause deterioration in the crystallinity of the Si film, which is a cap layer, or of the second SiGe film and causes increase in the leak current. Thus, reduction in the oxygen concentration between the first SiGe film/second SiGe film is found to be an indispensable condition for reduction in the leak current in a MOS transistor and, thereby, the present invention is formed.

That is to say, the present invention provides a method for manufacturing a semiconductor substrate, comprising the step of: forming a first buffer Si layer on a substrate having a silicon surface; epitaxially growing, in sequence, a first strained SiGe layer and a first Si layer above the first buffer Si layer; implanting ions into the resulting substrate followed by annealing so as to relax the lattice of the first strained SiGe layer and to thereby providing tensile strain in the first Si layer; and epitaxially growing, in sequence, a second buffer Si layer and a second SiGe layer above the first Si layer; and forming a second Si layer having tensile strain on the second SiGe layer.

In addition, the present invention provides a semiconductor substrate comprising a first buffer Si layer, a first SiGe layer, a first Si layer having tensile strain, a second buffer Si layer, a second SiGe layer and a second Si layer having tensile strain formed in this order above a substrate having a silicon surface, wherein the oxygen concentration at the interface between the first SiGe layer and the first Si layer, the interface between the first Si layer and the second buffer Si layer and/or the interface between the second buffer Si layer and the second SiGe layer is no greater than $1 \times 10^{16}$ cm$^{-3}$.

Furthermore, the present invention provides a semiconductor device comprising a semiconductor substrate having, in the following order, a first buffer Si layer, a first SiGe layer, a first Si layer having tensile strain, a second buffer Si layer, a second SiGe layer and a second Si layer having tensile strain above a substrate having a silicon surface; a gate electrode formed above the semiconductor substrate of the second Si layer side via a gate insulating film; and a source and a drain formed in the surface layer of the semiconductor substrate of the second Si layer side, wherein the total film thickness of the first SiGe layer and the second SiGe layer is set at a value that is not less than the width of a depletion layer, which expands when voltage is applied to the drain.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
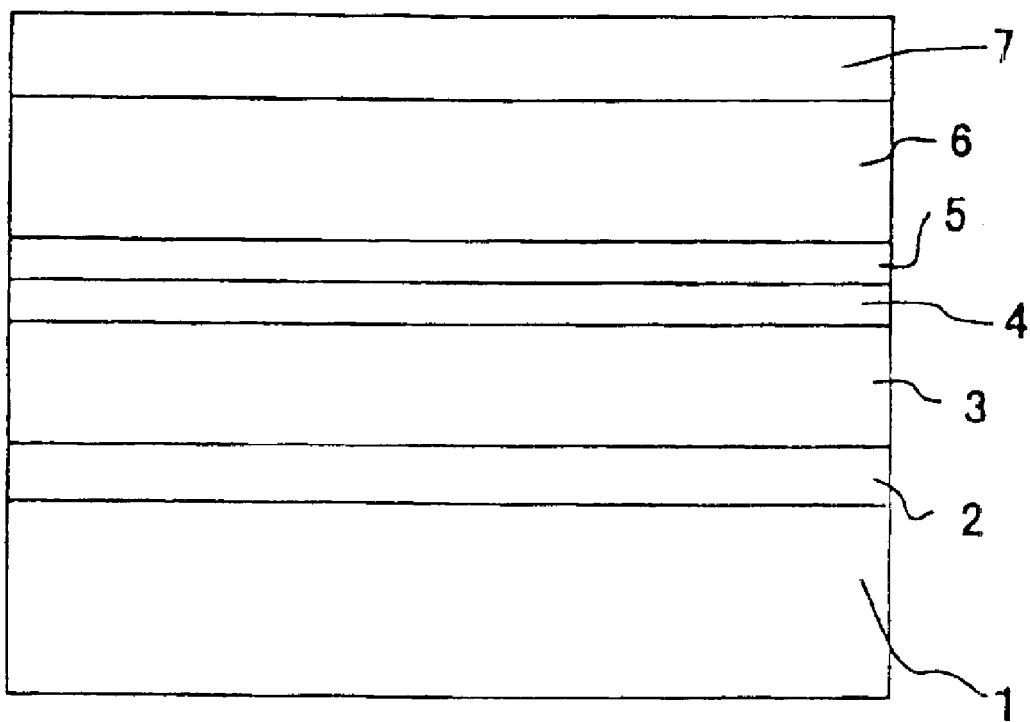
FIG. 1 is a schematic cross sectional view showing a semiconductor substrate according to an embodiment of the present invention.

According to the method for manufacturing a semiconductor substrate of the present invention, first, a first buffer Si layer, a first strained SiGe layer and a first Si layer are formed above a substrate having a silicon surface. Here, the substrate having a silicon surface may be a so-called SOI, SOS substrate, or the like, which have a monocrystal silicon layer on the surface, or a monocrystal silicon substrate. It is preferable for the substrate to be used after removal of the natural oxide film on the surface as a result of a washing step. Any method known in the art can be applied in the washing step. A variety of methods, such as boiling with sulfuric acid, RCA washing and/or acid washing using fluoric acid, for example, can be cited.

The first buffer Si layer, the first strained SiGe layer and the first Si layer can be formed according to a variety of known methods such as, for example, a CVD method, a sputtering method, a vapor deposition method or an MEB method. In particular, formation resulting from epitaxially growth according to a CVD method is preferable. Known conditions in the field can be selected for the film formation conditions in this case and, in particular, a temperature of from approximately 400° C. to 650° C. is appropriate for film formation. It is necessary to form the first strained SiGe layer and the first Si layer, from among the above described three layers, in a sequential manner. As for the method for sequential film formation, a method for switching material gases in order to form films in one apparatus is appropriate. Thereby, the residual oxygen concentration at the interface between the first strained SiGe layer and the first Si layer can be reduced.

It is preferable for the first buffer Si layer to have a film thickness that allows the effects of the dangling bonds existing of the surface of the substrate having a silicon surface to be reduced to as low a level as possible and, concretely, it is preferable for the first buffer Si layer to have a thickness of approximately 10 nm, or greater.

Though the Ge concentration of the first strained SiGe layer is not particularly limited, a Ge concentration of, for example, from approximately 10 atom % to 40 atom % can be cited and, preferably, a Ge concentration of from approximately 20 atom % to 30 atom % can be cited. It is preferable for the film thickness of SiGe to be no greater than the critical film thickness. The critical film thickness means a film thickness of the SiGe film wherein relaxation of lattice strain occurs in the SiGe film when the SiGe film is deposited on a substrate. Concretely, a film thickness of approximately 500 nm, or less, can be cited and a film thickness of from approximately 5 nm to 500 nm, preferably of from 10 nm to 300 nm, can be cited in the case wherein a SiGe film having a Ge concentration in the above described range is formed on a silicon substrate. Here, though the Ge concentration may change in a linear manner or in a discrete manner in the direction of the film thickness and in the direction of the surface of the layer (direction within a plane), it is preferable for the Ge concentration to be uniform.

The first Si layer is formed so that no crystal defects are introduced in the SiGe layer at the time of ion implantation carried out for relaxing the strain in the first strained SiGe layer in the subsequent step and is formed so that the substrate can be washed at the time when a semiconductor layer, such as of Si, is formed on the SiGe layer according to the same method used for washing the surface of the substrate as described above. It is preferable for the first Si layer to be a monocrystal silicon layer. It is preferable for the film thickness to be approximately 20 nm, or less, in the case, for example, of a SiGe film having a Ge concentration of 30%.

Ions are subsequently implanted into the resulting substrate and this substrate is annealed.

It is preferable to select ion species that satisfy the conditions wherein the ion species do not allow crystal defects to remain in the SiGe film through which the ions have passed, wherein the ion species introduce crystal defects in the vicinity of the average range (implantation peak) where the nuclei blocking performance is maximized directly before the average range (Rp), where the ions stop, and wherein the ion species do not electrically affect the device in the below described process, including annealing. For example, group IV elements such as silicon, carbon, germanium, and inert gases such as neon and helium, and hydrogen, for example, can be cited. In particular, light elements having a small mass are preferable. Buried crystal defects can be introduced in the ion implanted region without converting the region into an amorphous region in the case wherein ions of the above described elements are implanted. As for the ion species, hydrogen or helium is preferable and hydrogen is particularly preferable.

It is preferable for the average range (Rp) of implanted ions to be deeper than the film thickness of the first SiGe film. Furthermore, it is effective to set the average range (Rp) to be deeper than the combined film thickness of the first buffer Si layer, the first strained SiGe layer, and the first Si layer. That is to say, the average range of ion implantation is set at a depth that is below the surface of the first Si layer and, thereby, reduction in crystal defects in the two Si layers that extend to the surface of the SiGe film can be achieved. Accordingly, it is desirable to set the average range in a range between the surface of the first Si layer and a position approximately 50 nm below the surface of the first Si layer. Thus, the acceleration energy for ion implantation can be appropriately adjusted according to the used ion species, to the film thickness of the first buffer Si layer, to the film thickness of the first strained SiGe layer and to the film thickness of the first Si layer. In the case of hydrogen ion implantation, for example, an implantation energy of from approximately 10 keV to 50 keV, preferably from approximately 20 keV to 40 keV, can be cited. A dose of implanted ions of from approximately $1\times10^{15}$ cm$^{-2}$ to $1\times10^{17}$ cm$^{-2}$, preferably from approximately $1\times10^{15}$ cm$^{-2}$ to $5\times10^{16}$ cm$^{-2}$, can be cited.

As for heat treatment, furnace annealing, lamp annealing and RTA, for example, can be cited. The heat treatment can be carried out in an atmosphere such as an inert gas atmosphere (argon, or the like), a standard atmosphere, a nitrogen gas atmosphere, an oxygen gas atmosphere, and a hydrogen gas atmosphere. As for concrete conditions, the heat treatment can be carried out at a temperature in a range of from 700° C. to 950° C. for from approximately 10 minutes to 30 minutes.

Here, according to the present invention, it is preferable to form a protective film on the first Si layer before ion implantation is carried out. The material and the film thickness of the protective film here are not particularly limited and may be either an insulating film or a semiconductor film. Concretely, the protective film may be any of a thermal oxide film, a low temperature oxide film (LTO film), a high temperature oxide film (HTO film), a silicon oxide film formed by means of P-CVD and a silicon nitride film. As for the film thickness of the protective film, a thickness of from approximately 20 nm to 150 nm, for example, can be cited. In addition, it is preferable to remove the protective film after annealing and before the formation of the second buffer Si layer. A method for removing the protective film known in the field, such as wet etching using acid or alkaline solution, dry etching, or the like, can be cited.

Thereby, the lattice of the first strained SiGe layer can be relaxed and tensile strain can be provided in the first Si layer.

In addition, according to the present invention it is preferable to remove the natural oxide film by washing the first Si layer after annealing and before the formation of the below described second buffer Si layer, and to reduce the concentration of residual oxygen existing on the surface of the first Si layer. The same method as the method for washing the surface of the above described substrate having silicon surface can be cited as a method for such washing.

The second buffer Si layer and the second SiGe layer are epitaxially grown in sequence above the first Si layer and, furthermore, the second Si layer having tensile strain is formed on the second SiGe layer. Here, the formation of the second buffer Si layer, the second SiGe layer and the second Si layer can be carried out using the same method as the method for the formation of the above described first buffer Si layer, the first SiGe layer and the first Si layer. Here, it is necessary to epitaxially grow the second buffer Si layer and the second SiGe layer in sequence. The second buffer Si layer, the second SiGe layer and the second Si layer can be formed to have a thickness of from approximately 5 nm to 20 nm, a thickness of from approximately 100 nm to 300 nm and a thickness of from approximately 5 nm to 20 nm, respectively.

A semiconductor substrate formed in such a manner is in a condition wherein the oxygen concentrations at the interface between the first SiGe layer and the first Si layer, at the interface between the first Si layer and the second buffer Si layer, and/or at the interface between the second buffer Si layer and the second SiGe layer are kept very low. That is to say, the residual oxygen concentration at, at least, one interface from among these interfaces is approximately $1\times10^{16}$ cm$^{-3}$, or less, and the residual oxygen concentration at each of the interfaces is preferably approximately $1\times10^{16}$ cm$^{-3}$, or less, and the total residual oxygen concentration of all of the interfaces is more preferably approximately $1\times10^{16}$ cm$^{-3}$, or less. In such cases, in particular, deterioration in the crystallinity of the second Si layer and of the second SiGe layer due to residual oxygen at the interface between the first and second SiGe layers as well as a resulting increase in the leak current can effectively be prevented.

The semiconductor substrate formed as described above can be utilized as a substrate for forming a variety of semiconductor devices (NMOS, PMOS, CMOS transistors, flash memory cell transistors, for example) by carrying out a variety of steps in accordance with a conventional semiconductor process, such as the formation of an element isolation region, the formation of a gate insulating film and a gate electrode, the formation of a LDD or DDD region or a source/drain region, the formation of an interlayer insulating film, the formation of a wiring layer, and the like.

Concretely, the MOS transistor is formed of the gate electrode formed on the second Si layer of the semiconductor substrate via the gate insulating film and of source/drain in the surface layer on the second Si layer side of the semiconductor substrate. Here, the gate insulating film and the gate electrode can be formed by appropriately selecting the materials, the dimensions, the manufacturing methods, and the like, known in the field. It is preferable for the semiconductor substrate to have impurities doped in order to adjust the resistance of the substrate, and the like. As for the concentration thereof, an impurity concentration of from approximately $1\times10^{17}$ cm$^{-3}$ to $1\times10^{18}$ cm$^{-3}$, for example, can be cited. The source/drain can be formed by appropriately selecting the impurity concentration, the junction depths, and the like, that are conventionally required for forming semiconductor devices of this type. An impurity concentration of from approximately $1\times10^{19}$ cm$^{-3}$ to $1\times10^{21}$ cm$^{-3}$ and a junction depth of from approximately 50 nm to 200 nm, for example, can be cited. In addition, it is preferable for the combined film thickness of the first SiGe layer and the second SiGe layer in the semiconductor substrate to be set at a value that is not less than the width of the depletion layer, which expands in the case when voltage is applied to the drain, of such a semiconductor device. The drain voltage herein is not particularly limited and a voltage of from approximately 1.0V to 5.0V, for example, can be cited.

As described above, the mobility of electrons or holes can be increased so that the driving performance can be increased, specifically in the case wherein the combined film thickness of the first SiGe layer and the second SiGe layer is greater than the width of the depletion layer, in other words, in the case wherein the depletion layer is generated so as to have a width smaller than the combined film thickness of the first SiGe layer and the second SiGe layer.

In the following the preferred embodiments of the method for manufacturing a semiconductor substrate, the semiconductor substrate and a semiconductor device according to the present invention are described in detail in reference to the drawings.

The semiconductor substrate of the present invention has, in the following order, a first buffer Si layer 2, a first SiGe layer 3 wherein the strain has been relaxed, a first Si layer 4 having tensile strain, a second buffer Si layer 5, a second SiGe layer 6 and a second Si layer 7 having tensile strain above a silicon substrate 1, as shown in FIG. 1. In addition, the oxygen concentration is maintained at a low level at the interface between the first SiGe layer 3 and the first Si layer 4, at the interface between the first Si layer 4 and the second buffer Si layer 5 as well as the interface between the second buffer Si layer 5 and the second SiGe layer 6.

The above described semiconductor substrate can be formed according to the following method.

Figure 2A:
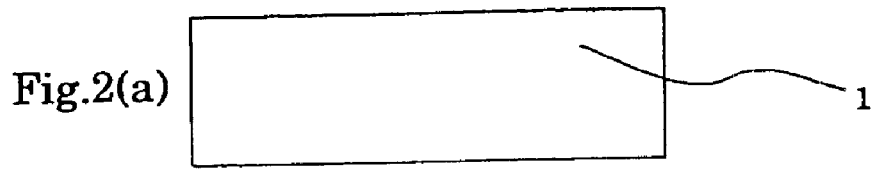
FIGS. 2(a) to 2(e) are schematic cross sectional diagrams showing manufacturing steps of the semiconductor substrate of FIG. 1.

First, as shown in FIG. 2(a), sulfuric acid boiling and RCA washing were carried out and, in addition, the natural oxide film on the surface of the p-type silicon (100) substrate 1 was removed using 5% dilute fluoric acid.

Figure 2B:
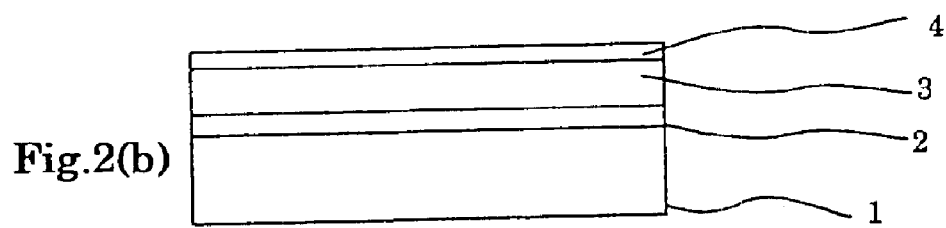

Next, as shown in FIG. 2(b), the first buffer Si layer 2 was epitaxially grown so as to have a thickness of 5 nm on the silicon substrate 1 using a low pressure chemical vapor deposition (LPCVD) unit. This buffer Si layer 2 was formed in order to restrict as much as possible the effects of the dangling bonds existing on the surface of the silicon substrate 1 after the pre-processing (sulfuric acid boiling, RCA washing and 5% dilute fluoric acid steps) of the silicon substrate 1. Then, the first SiGe layer 3 having a Ge concentration of 30% was epitaxially grown so as to have a film thickness of 150 nm and the first Si layer 4 was epitaxially grown so as to have a film thickness of 5 nm, in a sequential manner, using germane (GeH$_4$) and silane (SiH$_4$). That is to say, sequential film formation of the first buffer Si layer 2, the first SiGe layer 3 and the first Si layer 4 was herein carried out. Here, the film thickness of the first SiGe layer 3 was no greater than the critical film thickness. In addition, the first Si layer 4 is epitaxially grown in a sequential manner so as to have a thickness of 5 nm because the residual oxygen must reduced at the interface between the first SiGe layer 3 and the subsequently formed second SiGe layer 6. The surface of the first Si layer 4 provides the merit wherein the washing step, which is the same as for a conventional Si substrate, can be carried out even after the hydrogen ion implantation step.

Figure 2C:
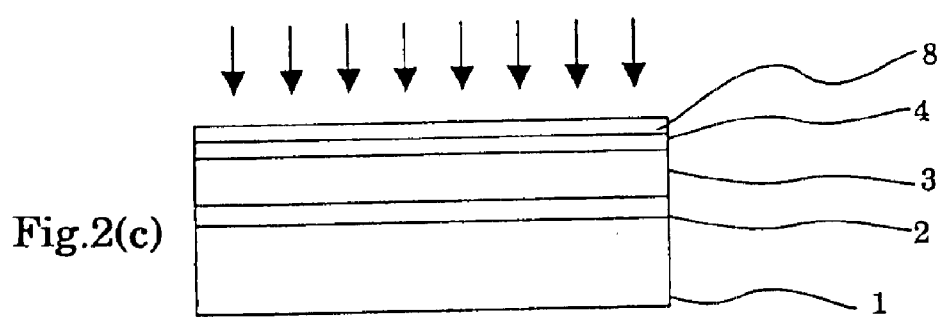

Next, as shown in FIG. 2(c), an oxide film 8 was formed as a pollution prevention film so as to have a thickness of 20 nm and hydrogen ion implantation was carried out under the conditions wherein the implantation energy was 18 keV, the dose was $3\times10^{16}$ H$^+$/cm$^2$ and angle of tilt was 7°.

Figure 2D:
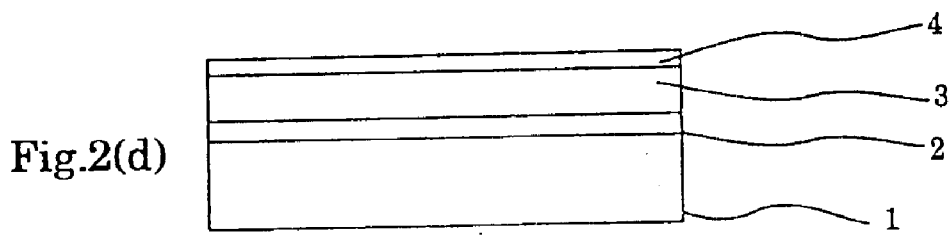

After that, as shown in FIG. 2(d), oxide film 8 was removed and annealing was carried out in a N$_2$ atmosphere for 10 minutes at a temperature of 800° C. It was confirmed by means of XRD analysis that this annealing makes the lattice strain of the first SiGe layer 3 sufficiently relaxed. In addition, the surface of the first SiGe layer 3 wherein the lattice strain had been relaxed was observed by means of a Nomarski microscope and no surface coarseness was observed but, rather, the surface was seen to be smooth. The lattice strain of the first SiGe layer 3 was sufficiently relaxed under the above described conditions and the crystallinity was good.

Figure 2E:
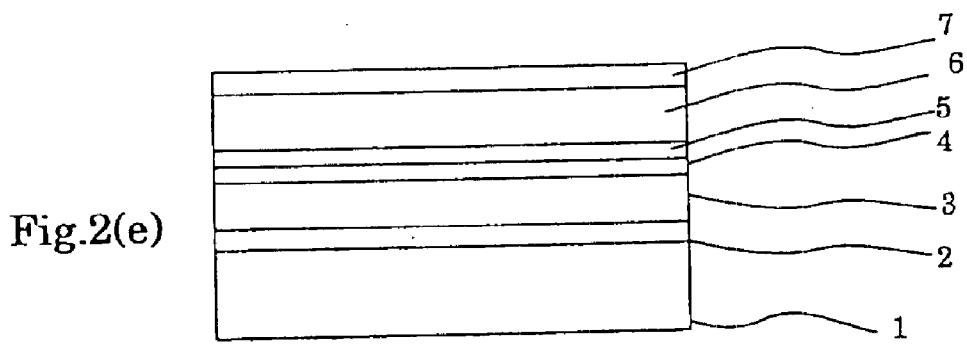

Next, the surface of the first Si layer 4 of the resulting substrate 1 underwent a treatment using 5% dilute fluoric acid as well as a washing treatment using ultrapure water. Next, as shown in FIG. 2(e), the second buffer Si layer 5 was epitaxially grown using a low pressure chemical vapor deposition unit so as to have a thickness of 5 nm. This layer was deposited for the same reason as the above described first buffer Si layer 2. Furthermore, the second SiGe layer 6 having a Ge concentration of 30% was epitaxially grown so as to have a thickness of 150 nm and the second Si layer 7 was epitaxially grown so as to have a thickness of 20 nm, in a sequential manner using germane (GeH$_4$) and silane (SiH$_4$). That is to say, sequential film formation of the second buffer Si layer, the second SiGe layer and the second Si layer was herein carried out.

Figure 3:
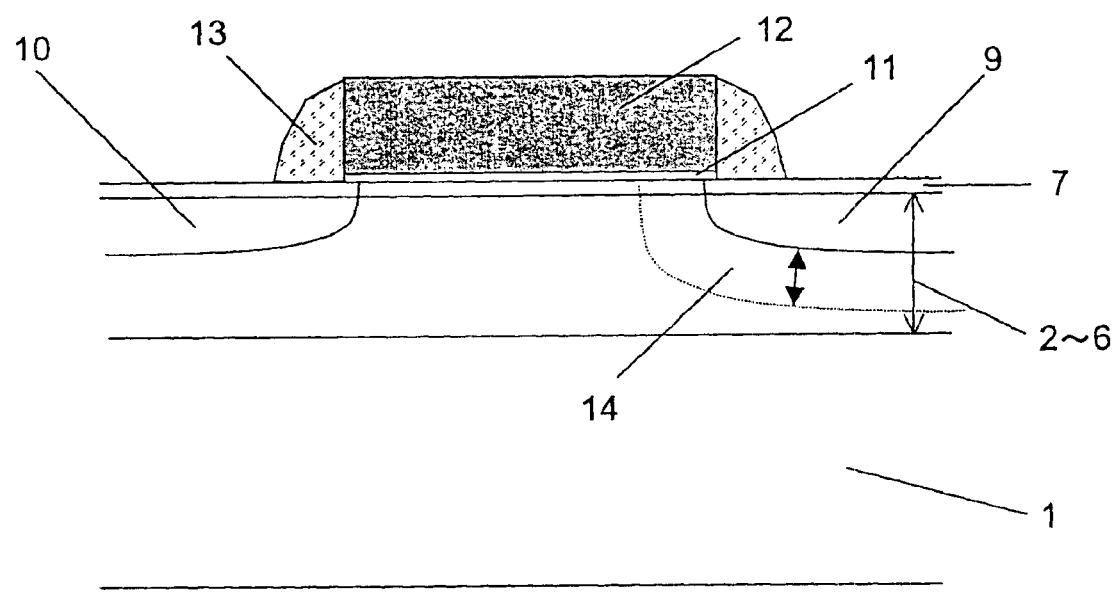
FIG. 3 is a schematic cross sectional view showing a major portion of a strained Si-MOS transistor, which is a semiconductor device that uses the semiconductor substrate according to the present invention.

A SiGe-CMOS (strained Si-CMOS) transistor, as shown in FIG. 3, was manufactured using the above described semiconductor substrate (FIG. 3 shows only one MOS transistor).

In this CMOS transistor, a gate electrode 12 is formed above the semiconductor substrate via a gate insulating film 11 according to a method known in the field and the gate electrode has sidewall spacers 13 on the sidewalls thereof. In addition, source/drain 10 and 9 are formed in the surface layer on the semiconductor substrate of the second Si layer 6 side in a self-aligning manner vis-à-vis the gate electrode 12. Impurities are uniformly doped (approximately $4\times10^{17}$ cm$^{-3}$, for example) into the semiconductor layers (that is to say, the first buffer Si layer 2, the first SiGe layer 3 wherein strain has been relaxed, the first Si layer 4, the second buffer Si layer 5, the second SiGe layer 6 and the second Si layer 7 having tensile strain) composed the semiconductor substrate of this MOS transistor so that a predetermined resistance value is gained. In addition, the impurity concentration and the junction depth of the source/drain 10 and 9 are set at not less than $1\times10^{21}$ cm$^{-3}$ and at approximately 110 nm.

A depletion layer 14 is formed in the CMOS transistor formed as described above in the case wherein a voltage of 2.5V is applied to the drain 9. The spread (approximately 140 nm, for example) of this depletion layer 14 becomes no greater than the combined film thickness of the first SiGe layer 3 (film thickness of 150 nm) and the second SiGe layer 6 (film thickness of 150 nm).

The evaluation of the characteristics of such a CMOS transistor was carried out. The results thereof are shown in FIGS. 4(a)–(b) and 5(a)–(b).

Figure 4A:
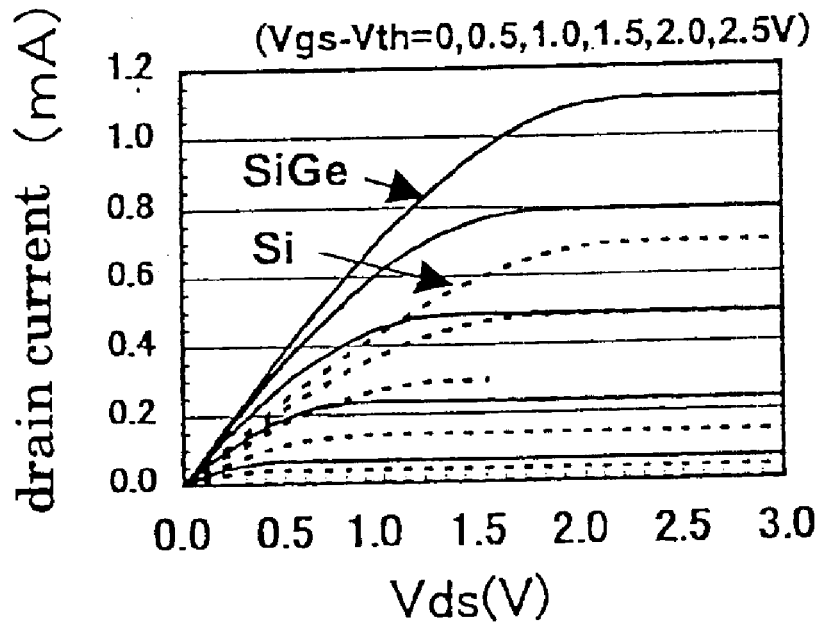
FIGS. 4(a) and 4(b) are graphs showing the electrical characteristics of the NMOS transistor shown in FIG. 3.
Figure 4B:
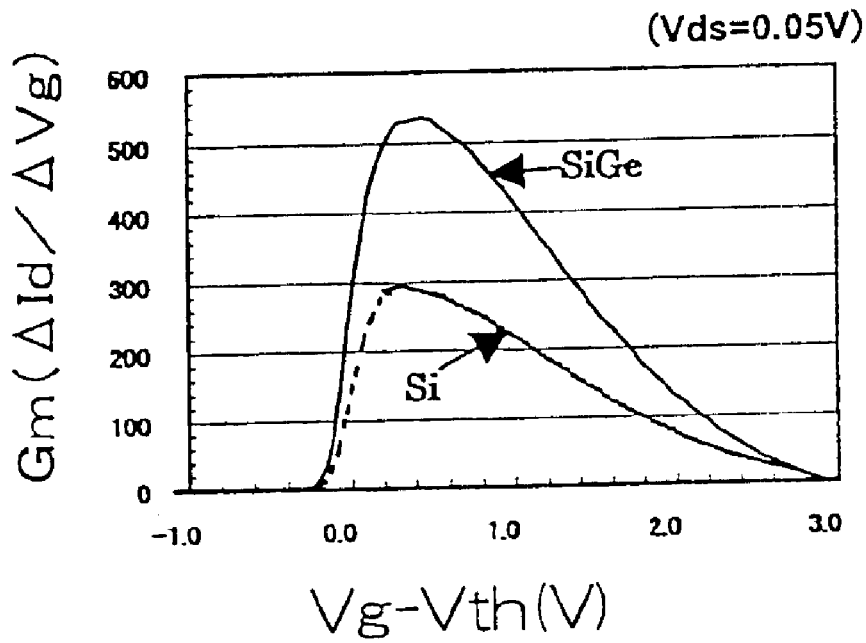
Figure 5A:
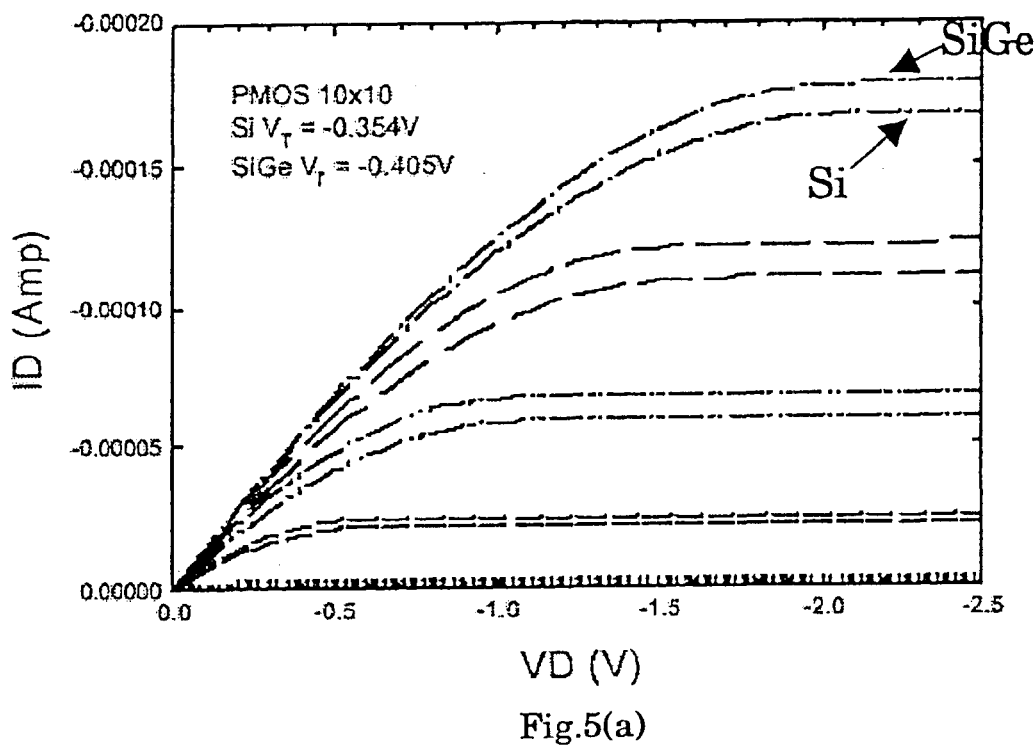
FIGS. 5(a) and 5(b) are graphs showing the electrical characteristics of the PMOS transistor shown in FIG. 3.
Figure 5B:
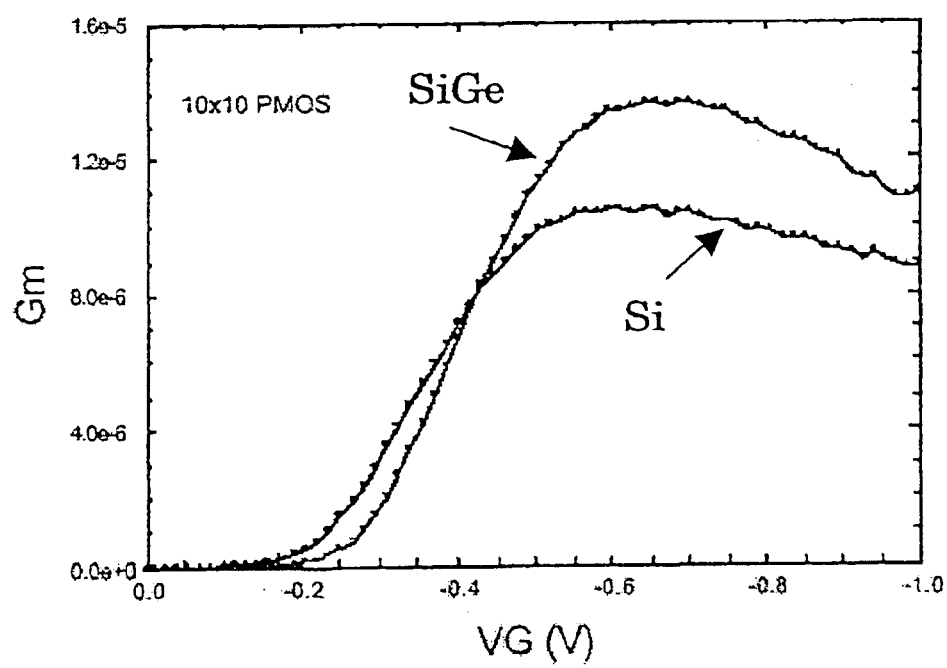
Figure 6:
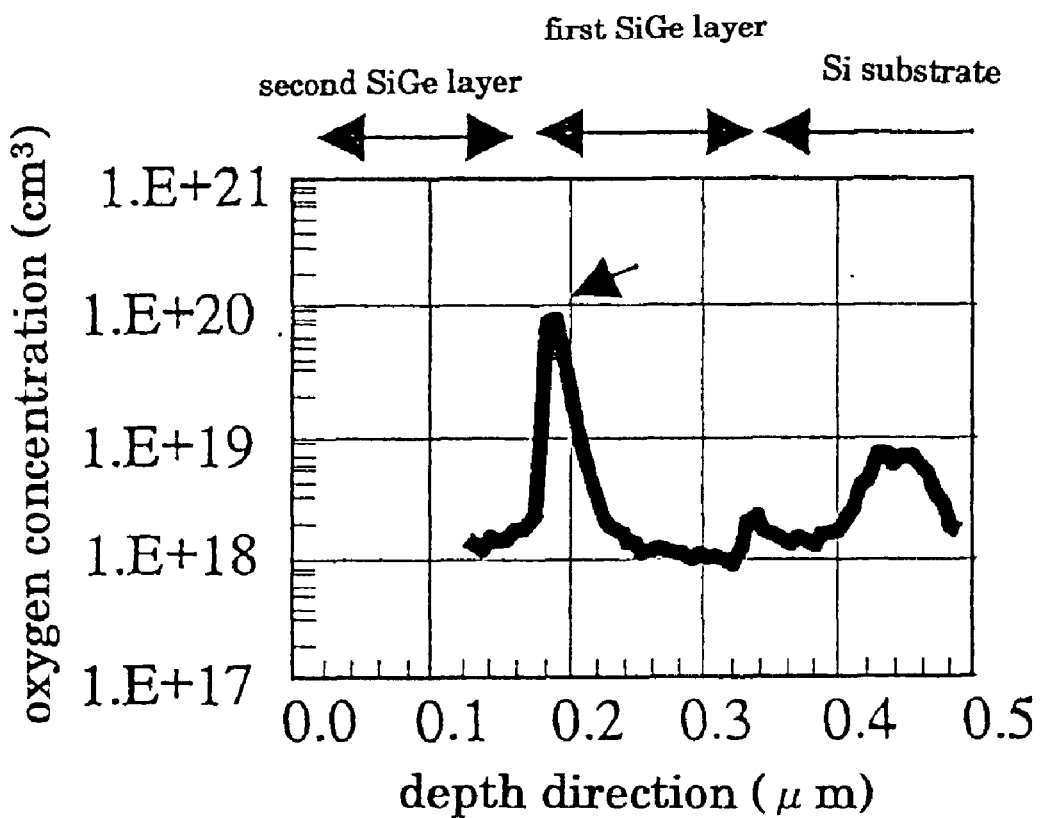
FIG. 6 is a graph showing the residual oxygen concentration between the first SiGe layer and second SiGe layer in a conventional MOS transistor as measured by SIMS.
Figure 7:
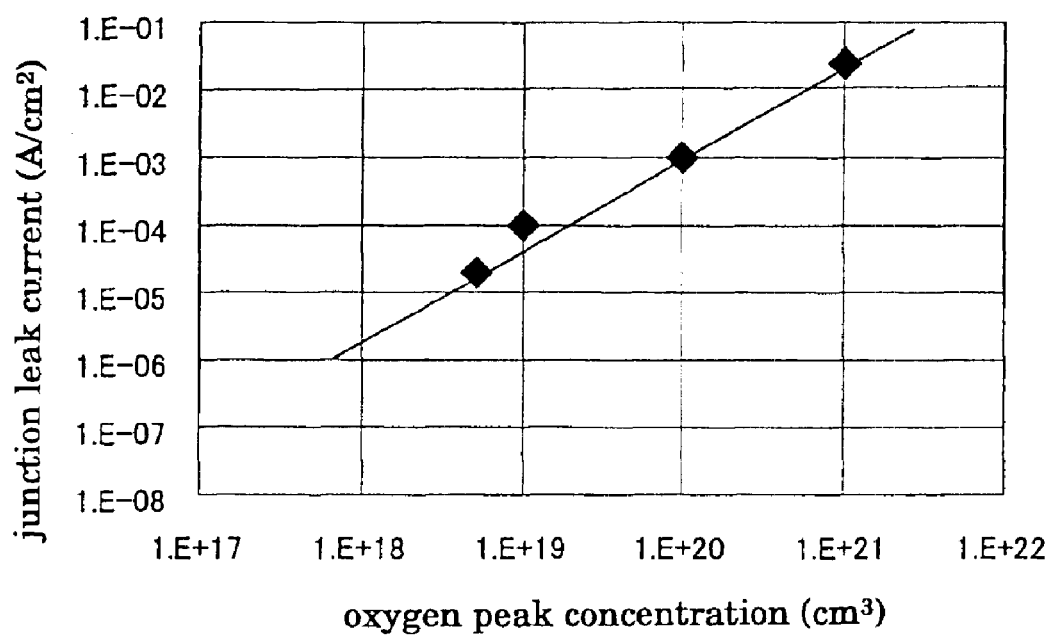
FIG. 7 is a graph showing the relationships between the junction leak current in the strained Si-MOS transistor and the peak concentration of the residual oxygen at the interface of the first SiGe layer/second SiGe layer.
Figure 8:
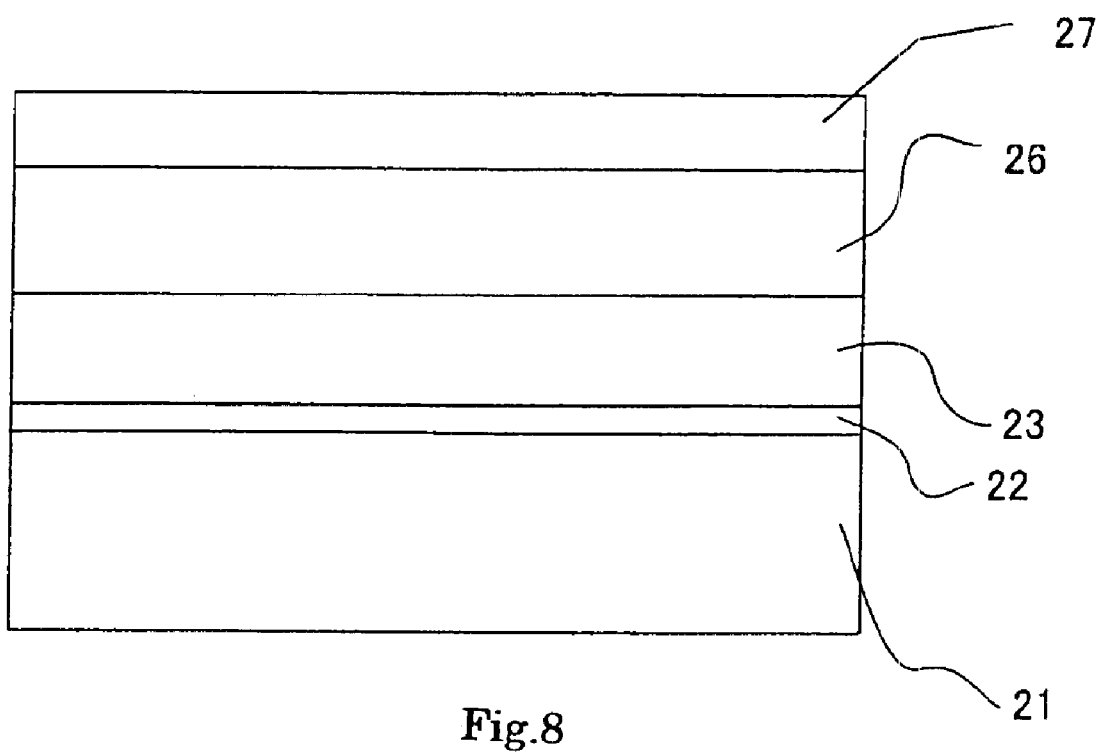
FIG. 8 is a schematic cross sectional view of a semiconductor substrate having a strained Si layer according to a prior art.

The Id-Vd characteristics (see FIG. 4(a)) and the Gm characteristics (see FIG. 4(b)) of the strained Si-NMOS (SiGe NMOS) transistor, which is a semiconductor device according to the present invention, and of an NMOS transistor manufactured in a conventional Si substrate are compared in FIGS. 4(a) and 4(b). Here, the effective Ge concentration of the second SiGe layer is 16% in FIGS. 4(a) and 4(b). The effective Ge concentration is indicated by the value gained by multiplying the Ge concentration of the actually formed SiGe layer by the relaxation ratio of SiGe. The Id-Vd characteristics (see FIG. 5(a)) and the Gm characteristics (see FIG. 5(b)) of the strained SiPMOS (SiGe PMOS) transistor, which is a semiconductor device according to the present invention, and of a PMOS transistor manufactured in a conventional Si substrate are compared in FIGS. 5(a) and 5(b). The effective Ge concentration of the second SiGe layer is 24% in FIGS. 5(a) and 5(b).

It is understood from FIGS. 4(a) and 4(b) that the driving performance of either the strained Si-NMOS or PMOS transistor has increased in regard to the Id-Vd characteristics. In addition, it is understood from FIGS. 5(a) and 5(b) that the mobility in either the strained Si-NMOS or PMOS transistor has increased in regard to the Gm characteristics.

In addition, measurements show that junction leak current due to the oxygen peak concentration is reduced in the strained Si-MOS transistor according to the present invention in comparison with the MOS transistor manufactured in the conventional Si substrate by not less than one order. It was confirmed that this reduction was caused by reduction in the oxygen peak concentration in the manufacturing steps of the above described semiconductor substrate.

The residual oxygen between the first SiGe layer and the second SiGe layer, which affects the crystallinity, can be reduced according to the present invention. Thereby, it becomes possible to manufacture a semiconductor substrate having a strained Si layer/strain relaxed SiGe layer of a good crystallinity by reducing the density of the penetrating dislocations in the SiGe layer.

In addition, the concentration of residual oxygen between the second buffer layer and the first Si layer can be further reduced by washing the surface of the first Si layer before the formation of the second buffer layer so that a semiconductor substrate having a good crystallinity can be gained. In particular, the effects thereof are significant in the case wherein the oxygen concentration is no greater than $1\times10^{16}$ cm$^{-3}$ at the interface between the first SiGe layer and the first Si layer, at the interface between the first Si layer and the second buffer Si layer and/or at the interface between the second buffer Si layer and the second SiGe layer.

Furthermore, no crystal defects are introduced into the first SiGe layer and the lattice strain can be sufficiently relaxed in the case wherein the first SiGe layer is formed so as to have a film thickness of no greater than the critical film thickness and, thereby, a high performance semiconductor substrate can be gained wherein the number of crystal defects is further reduced.

In addition, the mobility of electrons or holes in a semiconductor device can be increased in the case wherein the semiconductor device is formed using the above described semiconductor substrate and wherein the combined film thickness of the first SiGe layer and of the second SiGe layer is set at a value that is not less than the width of the depletion layer, which expanded after voltage was applied to the drain. In addition, the driving performance of the semiconductor device can also be increased. Therefore, it becomes possible to gain a high performance semiconductor device.

What is claimed is:

1. A method for manufacturing a semiconductor substrate, comprising the steps of:

forming a first buffer Si layer on a substrate having a silicon surface;

epitaxially growing, in sequence, a first strained SiGe layer and a first Si layer above the first buffer Si layer;

implanting ions into the resulting substrate followed by annealing so as to relax the lattice of the first strained SiGe layer and to thereby provide tensile strain in the first Si layer; and epitaxially growing, in sequence, a second buffer Si layer and a second SiGe layer above the first Si layer; and forming a second Si layer having tensile strain on the second SiGe layer.

2. The method for manufacturing a semiconductor substrate of claim 1, further comprising, after tensile strain is provided in the first Si layer and before the second buffer Si layer is formed on the resulting substrate, washing the first Si layer to reduce the concentration of residual oxygen existing on the surface of the first Si layer.

3. The method for manufacturing a semiconductor substrate of claim 1 wherein the concentration of residual oxygen existing on the surface of the first Si layer is no greater than $1\times10^{16}$ cm$^{-3}$ after washing.

4. The method for manufacturing a semiconductor substrate of claim 1 wherein the first strained SiGe layer is no greater than the critical film thick.

5. The method for manufacturing a semiconductor substrate of claim 4 wherein the first strained SiGe layer is 10 to 300 nm thick.

* * * * *